United States Patent [19]

Kim

[11] Patent Number: 5,699,299

[45] Date of Patent: Dec. 16, 1997

[54] SEMICONDUCTOR MEMORY DEVICE WITH A PLURALITY OF COLUMN SELECT LINES AND COLUMN DRIVING METHOD THEREFOR

[75] Inventor: Chul-Soo Kim, Suwon, Rep. of Korea

[73] Assignee: Samsung Electronics Co., Ltd., Suwon, Rep. of Korea

[21] Appl. No.: 590,707

[22] Filed: Dec. 5, 1995

[30] Foreign Application Priority Data

Dec. 5, 1994 [KR] Rep. of Korea ............... 32810/1994

[51] Int. Cl.$^6$ ................................................. G11C 13/00
[52] U.S. Cl. ........................................ 365/189.01; 365/200
[58] Field of Search ..................... 365/189.01, 230.01, 365/200

[56] References Cited

U.S. PATENT DOCUMENTS 5,548,225  8/1996  Roundtree et al. ............... 365/200

*Primary Examiner*—Terrell W. Fears
*Attorney, Agent, or Firm*—Cushman Darby & Cushman, IP Group of Pillsbury Madison & Sutro LLP

[57] ABSTRACT

A semiconductor memory device with a plurality of column select lines and a column driving method therefore are disclosed. In a semiconductor memory device including memory blocks each having a plurality of column lines and including a column decoder for receiving a plurality of column predecoding signals and selecting the column lines, the column lines contained in each of the memory blocks are divided into a plurality of column groups. Divided column predecoding lines for selecting the column lines contained in the column groups are arranged in a corresponding memory block, and the divided column predecoding line groups adjacently extend over any one side of the corresponding memory block.

17 Claims, 3 Drawing Sheets

SEMICONDUCTOR MEMORY DEVICE WITH A PLURALITY OF COLUMN SELECT LINES AND COLUMN DRIVING METHOD THEREFOR

BACKGROUND OF THE INVENTION

The present invention relates to semiconductor memory devices, and more particularly to a semiconductor memory device and a column driving method therefor which generates a plurality of column select lines from a plurality of predecoding signals and select a column of a memory cell array.

A typical semiconductor memory device includes a memory cell array consisting of a plurality of word lines, bit lines and memory cells, and structure for writing or reading necessary data by designating a memory cell included in such a memory cell array. As is well known to those skilled in the art, specific data is written into or read from a specific memory cell by generating a plurality of decoding signals corresponding to a row and a column using an address applied from the exterior of the chip and then appropriately arranging and driving these decoding signals. A peripheral circuit column decoder performs such functions and receives predecoding signals generated from a predecoder and generates column select signals for connecting a bit line within the selected memory cell array to an input/output line.

FIG. 1 illustrates a conventional column decoder. Column signals DCA3B4B, DCA3B4, DCA5B6B and DCA7B, supplied to a NOR logic circuit NOR1, consisting of PMOS transistors P1–P3 and NMOS transistors N1–N3, and to another NOR logic circuit NOR2 consisting of PMOS transistors P4–P6 and NMOS transistors N4–N7, are used for selecting column lines divided into a few groups from a portion of the memory cell array. Assuming that an 8 Megabit (Mb) memory cell array is split into 4 memory banks each having 2 Mb capacity, each memory bank is split into 4 memory blocks, and column lines of each memory block are divided into 32 groups (hereinafter referred to as "column groups"), the above-described column predecoding signals are used for selecting one column group by the combination of original column predecoding signals DCA3, DCA4, DCA5, DCA6 and DCA7, which are used for selecting 128 column lines corresponding to one memory block.

NOR gates NR1–NR4 and NR5–NR8 commonly receive the signals generated from the NOR logic circuits NOR1 and NOR2, respectively. The NOR gates NR1 and NR5 commonly receive a column predecoding signal DCA0B1B2BU. The NOR gates NR2 and NR6 commonly receive a column predecoding signal DCA0B1B2BL. The NOR gates NR3 and NR7 commonly receive a column predecoding signal DCA01B2BU, and the NOR gates NR4 and NR8 commonly receive a column predecoding signal DCA01B2BL. The symbols -U and -L are used for classifying a pair of column select signals from one memory block, and hereinafter they will be used for that purpose. The NOR gate NR1 generates a column select signal CSL0U via series-connected inverters I1 and I5 and the NOR gate NR2 generates a column select signal CSL0L via series-connected inverters I2 and I6. The NOR gate NR3 generates a column select signal CSL1U via series-connected inverters I3 and I7 and the NOR gate NR4 generates a column select signal CSL1L via series-connected inverters I4 and I8. The NOR gate NR5 generates a column select signal CSL2U via series-connected inverters I9 and I13 and the NOR gate NR6 generates a column select signal CSL2L via series-connected inverters I10 and I14.

Similarly, the NOR gate NR7 generates a column select signal CSL3U via series-connected inverters I11 and I15 and the NOR gate NR8 generates a column select signal CSL3L via series-connected inverters I12 and I16.

Referring to FIG. 2, the above-described column decoder is applied to a conventional semiconductor memory device. In FIG. 2, one memory bank of 2 Mb memory capacity corresponding to a quarter of a memory cell array is shown. One memory bank is divided into 4 memory blocks MB1, MB2, MB3 and MB4. One memory block consists of 128 column lines and 128 column select signals CSL0U, CSL0L, CSL1U, CSL1L, ..., CSL63U and CSL63L corresponding thereto. One memory block is classified into 8 subblocks SB1–SB8 each having 256 word lines. The symbol A designates a strapping area for connecting the column select signal to the column predecoding signal.

As shown in FIG. 2, 16 column predecoding lines 6, which transmit 16 column predecoding signals DCA0B1B2BU–DCA012L, extend across all memory banks to select the column lines corresponding to the memory bank of 2 Mb. This occupies a substantial peripheral circuit area. Further, since these lines use conductive polysilicon, the lines are lengthened, and thus, the signal transmission speed and efficiency are lowered due to line loading.

In the actual layout of the semiconductor memory device, 128 column lines (lines to which the column select signals are buried) included in one memory block are not respectively strapped with the column predecoding lines (lines to which the column predecoding signals are buried). There are 4 strapping areas, and 32 column lines are strapped with the column predecoding lines at one strapping area in order to raise the efficiency of a manufacturing process and design. In the semiconductor memory device, such lines use conductive polysilicon and are formed at the same level as polysilicon used in the gate of a transistor. At the strapping area between the column lines and the column predecoding lines, it is inevitable that signal transition speed is delayed due to the loading of the polysilicon. If the column predecoding lines are extended over one memory bank as shown in FIG. 2, such phenomenon becomes worse.

SUMMARY OF THE INVENTION

It is therefore an object of the invention to provide a semiconductor memory device with an improved layout.

It is another object of the invention to provide a semiconductor memory device which increases signal transmission and transition speed in transmitting a column related signal.

It is a further object of the invention to provide a column driving method for achieving a noise distribution effect in transmitting a column related signal.

According to one aspect of the invention, in a semiconductor memory device including memory blocks each having a plurality of column lines and including a column decoder for receiving a plurality of column predecoding signals and selecting the column lines, the column lines contained in each of the memory blocks are divided into a plurality of column groups. Divided column predecoding lines for selecting the column lines contained in the column groups are arranged in a corresponding memory block, and the divided column predecoding line groups adjacently extend over any one side of the corresponding memory block.

According to another object of the invention, in a column driving method for a semiconductor memory device including memory blocks each having a plurality of column lines and including a column decoder for receiving a plurality of column predecoding signals and selecting the column lines, the column lines contained in each of the memory blocks are divided into a plurality of column groups. Divided column predecoding lines for selecting the column lines contained in the column groups are arranged in a corresponding memory block, and one column group is simultaneously activated from each memory block.

DETAILED DESCRIPTION OF THE PREFERRED EMBODIMENT

Figure 1:
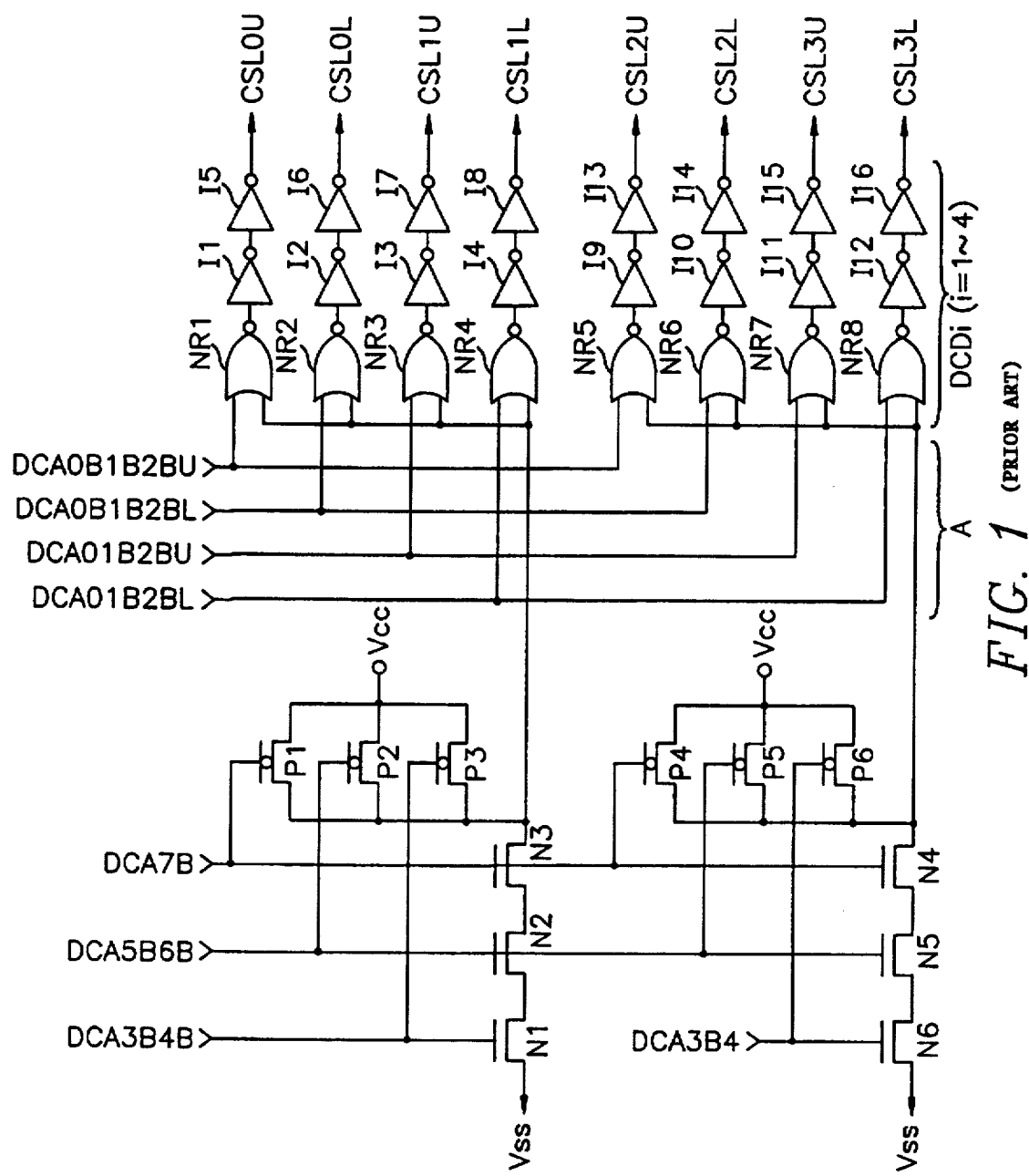
FIG. 1 is a circuit diagram of a conventional column decoder used in a semiconductor memory device.
Figure 2:
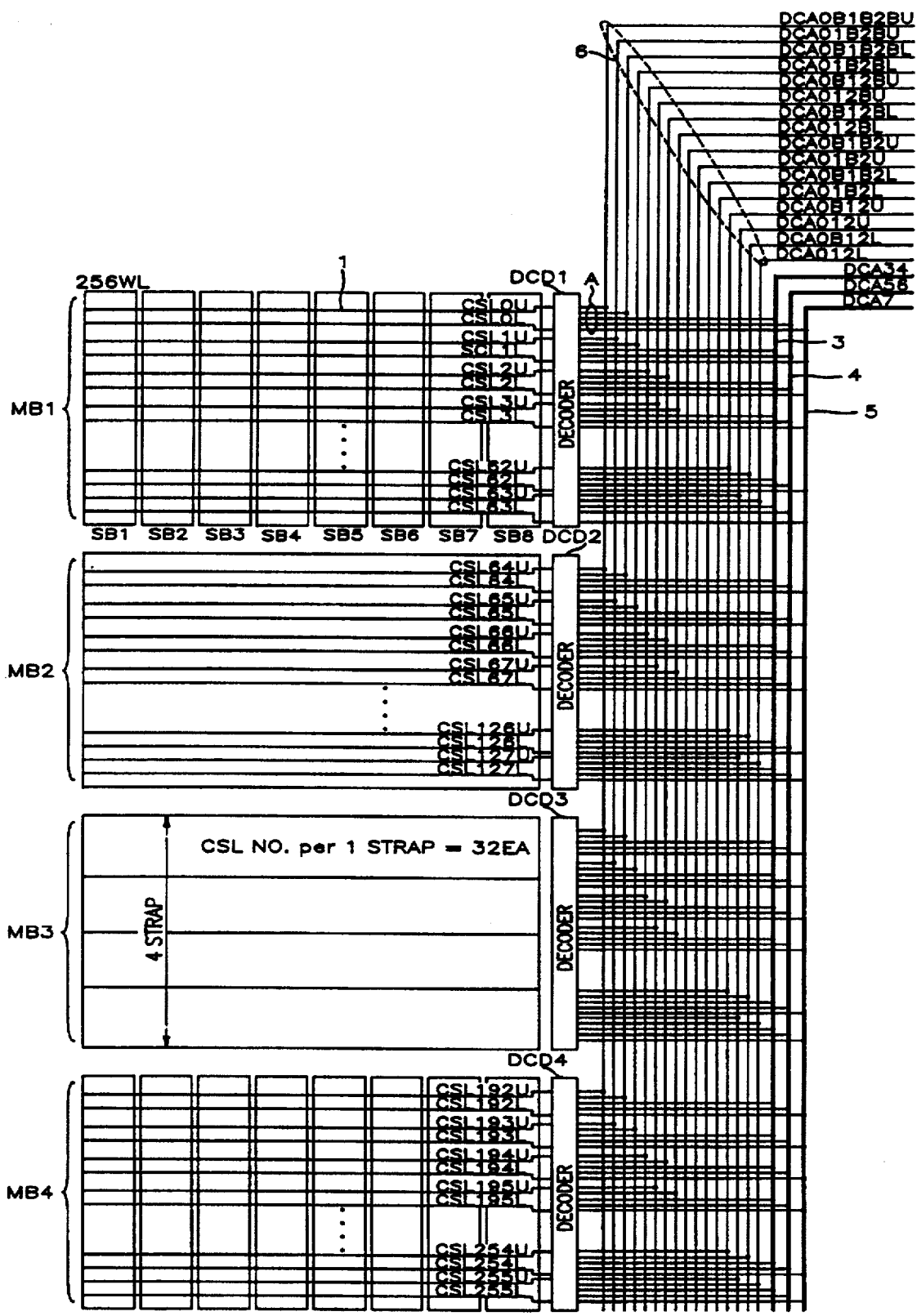
FIG. 2 illustrates a conventional column decoding construction.
Figure 3:
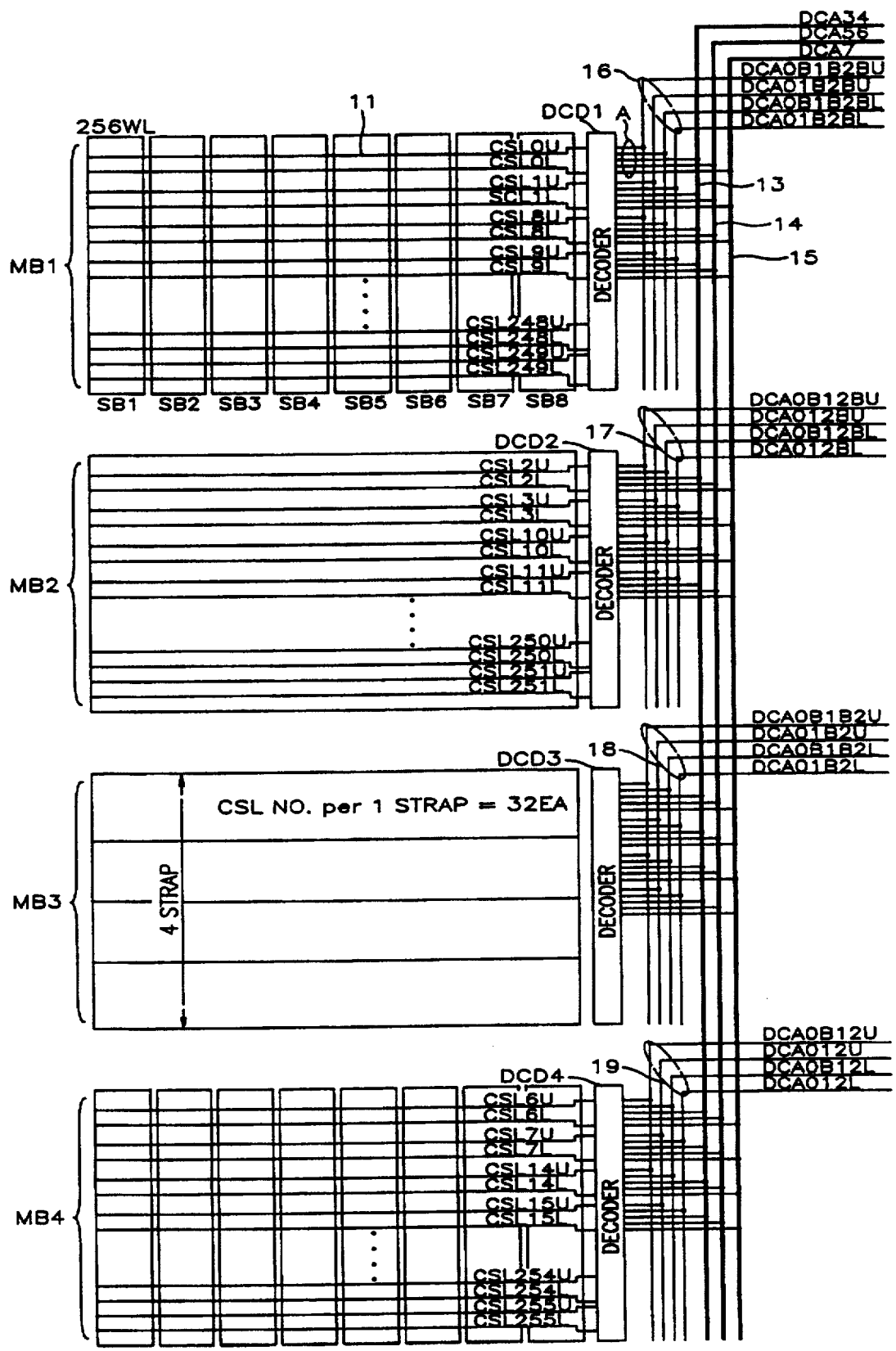
FIG. 3 illustrates a column decoding construction according to the present invention.

The capacity of a memory cell array shown in FIG. 3 is the same as that shown in FIG. 2. That is, 4 memory blocks MB1–MB4 have the memory capacity of 2 Mb. Each memory block is divided into 8 subblocks SB1–SB8. 128 column lines are arranged in one memory block and these column lines are divided into 32 groups. Respective memory blocks MB1–MB4 are respectively connected to corresponding column decoders DCD1–DCD4. In strapping column select signals with column predecoding signals, each memory block has 4 strapping areas consisting of 32 column lines and column predecoding lines. It should be noted that the construction of FIG. 3 and that of FIG. 2 differ widely in the connected relationship between the column select signals and the column predecoding signals and the layout of lines therefor.

In the layout of column lines 11 to which the column select signals within each memory block are buried, the column select signals are arranged in order of CSLiU, CSLiL, CSLjU and CSLjL (where i=0+8n, j=1+8n, n=0–31) at the first memory block MB1. That is, the order is as follows: CSL0U, CSL0L, CSL1U, CSL1L, CSL8U, CSL8L, CSL9U, CSL9L, . . . , CSL248U, CSL248L, CSL249U, CSL249L. At the second memory block MB2, the column select signals are arranged in order of CSLiU, CSLiL, CSLjU and CSLjL (where i=2+8n, j=3+8n, n=0–31). That is the order is as follows: CSL2U, CSL2L, CSL3U, CSL3L, CSL10U, CSL10L, CSL11U, CSL11L, . . . , CSL250U, CSL250L, CSL251U, and CSL251L. At the third memory block MB3, the column select signals are arranged in order of CSLiU, CSLiL, CSLjU and CSLjL (where i=4+8n, j=5+8n, n=1–31). That is, the order is as follows: CSL4U, CSL4L, CSL5U, CSL5L, CSL12U, CSL12L, CSL13U, CSL13L, . . . , CSL252U, CSL252L, CSL253U, and CSL253L. At the fourth memory block MB4, the column select signals are arranged in order of CSLiU, CSLiL, CSLjU and CSLjL (where i=6+8n, j=7+8n, n=0–31). That is, the order is as follows: CSL6U, CSL6L, CSL7U, CSL7L, CSL14U, CSL14L, CSL15U, CSL15L, . . . , CSL254U, CSL254L, CSL255U, and CSL255L. Line groups 13 (4 bits), 14 (4 bits) and 15 (2 bits) in which column predecoding signals DCA34, DCA56 and DCA7 for selecting 32 column groups divided within each memory block extend over all 4 memory blocks. However, column decoding lines 16, 17, 18 and 19 conveying column predecoding signals (combination signals of DCA0, DCA1, DCA2, -U and -L) for generating the column select signals to select 4 column lines contained in each of 32 column groups within each memory block extend over the core of certain of the memory blocks. That is, at the first memory block MB1, 4 column decoding lines 16 corresponding to column predecoding signals DCA0B1B2BU, DCA01B2BU, DCA0B1B2BL and DCA01B2BL are extended. At the second memory block MB2, 4 column decoding lines 17 corresponding to column predecoding signals DCA0B12BU, DCA012BU, DCA0B12BL, and DCA012BL are extended. At the third memory block MB3, 4 column decoding lines 18 corresponding to column predecoding signals DCA0B1B2U, DCA01B2U, DCA0B1B2L and DCA01B2L are extended. At the fourth memory block MB4, 4 column decoding lines 19 corresponding to column predecoding signals DCA0B12U, DCA012U, DCA0B12L, and DCA012L are extended.

In activating a column included in each memory block, the column select signals driving 4 column lines contained in one column line group (corresponding to one strapping area) are activated at each memory block during one data access cycle. That is, 4 column lines are driven at each memory block and 16 column lines are simultaneously driven. For example, at the first memory block MB1, the column select signals CSL0U, CSL0L, CSL1U and CSL1L, driving 4 column lines included in the first column group (the first strapping area), are activated. At the second memory block MB2, the column select signals CSL2U, CSL2L, CSL3U and CSL3L, driving 4 column lines included in the first column group (the first strapping area), are activated. At the third memory block MB3, the column select signals CSL4U, CSL4L, CSL5U and CSL5L, driving 4 column lines included in the first column group (the first strapping area), are activated. At the fourth memory block MB4, the column select signals CSL6U, CSL6L, CSL7U and CSL7L, driving 4 column lines included in the first column group (the first strapping area), are activated. Thus, effective noise distribution can be achieved by distributing the column lines to each memory block.

The column predecoding lines shown in FIG. 3 are strapped by 32 areas per memory block, and the same applies to FIG. 2. However, FIG. 3 shows the shortened length of column decoding lines compared with FIG. 2 in which each of 16 column decoding lines extend over all 4 memory blocks. Hence, the delay of signal transmission or lowering of the signal transition speed caused by the line loading of polysilicon and capacity can be suppressed.

In FIG. 3, since the column predecoding lines contained in each memory block can be arranged at an area in which power voltage and a ground voltage power are formed, more unused chip space than the FIG. 2 layout is ensured. When implementing block writing in a video RAM, etc., the construction of FIG. 2 may create noise due to mutual capacitance since adjacent column lines of a few bits are driven within one memory block. In FIG. 3, since the column lines in one memory block are not adjacent to two 2 Mb memory banks, overall noise suppression occurs.

As described above, line loading from the column predecoding line to the column line within the memory cell array is reduced. Therefore, the transmission efficiency of the column select signal is improved and the margin of layout is increased. Furthermore, noise is reduced, especially when block writing operations are performed.

While the invention has been particularly shown and described with reference to a preferred embodiment thereof, it will be understood by those skilled in the art that foregoing and other changes in form and details may be made without departing from the spirit and scope of the invention.

What is claimed is:

1. A semiconductor memory device comprising:
   a memory array including a plurality of memory blocks, each memory block including:
      a plurality of column lines which form a plurality of column groups, and
      a column decoder for receiving a plurality of column predecoding signals and selecting one of said plurality of column lines; and
   a plurality of divided column predecoding lines for transmitting said column predecoding signals to each of said column decoders, certain of said plurality of divided column predecoding lines extending by each of said column decoders, and other of said plurality of divided column predecoding lines extending by only one of said column decoders.

2. The semiconductor memory device according to claim 1, wherein said plurality of divided column predecoding lines is divided into a plurality of predecoding line groups, each predecoding line group containing a sub-plurality of divided column predecoding lines which correspond to one of said memory blocks.

3. The semiconductor memory device according to claim 2 wherein each of said column lines has a corresponding address, and wherein said column lines are arranged such that addresses of column lines in each column group of each memory block do not sequentially correspond with addresses of column lines of other column groups of the same memory block.

4. The semiconductor memory device according to claim 3 wherein each column group contains two column lines.

5. The semiconductor memory device according to claim 3 wherein said column lines are arranged such that one column line from each of said column groups is simultaneously activated during a column select operation.

6. The semiconductor memory device according to claim 3 wherein said plurality of memory blocks is at least four and each of said four memory blocks contain two column lines in said column group which correspond to two sequential addresses out of eight sequential addresses from a sequential group of addresses of said memory array.

7. The semiconductor memory device according to claim 6 wherein each of said plurality of memory blocks has a memory capacity of at least 2 Mb.

8. A semiconductor memory device comprising:
   a memory array including a plurality of memory blocks, each memory block including:
      a plurality of column lines which form a plurality of column groups, and
      a column decoder for receiving a plurality of column predecoding signals and selecting one of said plurality of column lines; and
   a plurality of divided column predecoding lines for transmitting said column predecoding signals to each of said column decoders, certain of said plurality of divided column predecoding lines extending by each of said column decoders, and other of said plurality of divided column predecoding lines extending by only some of said column decoders.

9. The semiconductor memory device according to claim 8, wherein said plurality of divided column predecoding lines is divided into a plurality of predecoding line groups, each predecoding line group containing a sub-plurality of divided column predecoding lines which correspond to one of said memory blocks.

10. The semiconductor memory device according to claim 9 wherein each of said column lines has a corresonding address and wherein said column lines are arranged such that addresses of column lines in each column group of each memory block do not sequentially correspond with addresses of column lines of other column groups of the same memory block.

11. The semiconductor memory device according to claim 10 wherein each column group contains two column lines.

12. The semiconductor memory device according to claim 10 wherein said column lines are arranged such that one column line from each of said column groups is simultaneously activated during a column select operation.

13. The semiconductor memory device according to claim 10 wherein said plurality of memory blocks is at least four and each of said four memory blocks contain two column lines in said column group which correspond to two sequential addresses out of eight sequential addresses from a sequential group of addresses of said memory array.

14. The semiconductor memory device according to claim 13 wherein each of said plurality of memory blocks has a memory capacity of at least 2 Mb.

15. A column driving method for a semiconductor memory device including a plurality of memory blocks each having a plurality of column lines and including a column decoder for receiving a plurality of column predecoding signals and selecting certain of said plurality of column lines, said method comprising the steps of:
   dividing said plurality of column lines contained in each of said memory blocks into a plurality of column groups;
   arranging a plurality of divided column predecoding lines for selecting said column lines into a plurality of predecoding line groups, each predecoding line group containing a sub-plurality of divided column predecoding lines which correspond to one of said memory blocks; and
   simultaneously activating one column group from each memory block.

16. The column driving method according to claim 15 wherein the step of arranging said plurality of divided column predecoding lines includes the step of extending certain of said plurality of divided column predecoding lines by each of said column decoders, and extending other of said plurality of divided column predecoding lines by only some of said column decoders.

17. The column driving method according to claim 15 wherein the step of dividing said plurality of column lines includes the step of dividing said column lines so that addresses in each column group of each memory block do not sequentially correspond with addresses of other column groups of the same memory block.

* * * * *